United States Patent
Wang

(10) Patent No.: US 6,774,394 B2
(45) Date of Patent: Aug. 10, 2004

(54) INLINE DETECTION DEVICE FOR SELF-ALIGNED CONTACT DEFECTS

(75) Inventor: Ting-Sing Wang, Hsinchu Hsien (TW)

(73) Assignee: Promos Technologies Inc., Hsinchu (TW)

( * ) Notice: Subject to any disclaimer, the term of this patent is extended or adjusted under 35 U.S.C. 154(b) by 0 days.

(21) Appl. No.: 10/061,562

(22) Filed: Feb. 1, 2002

(65) Prior Publication Data

US 2003/0040176 A1 Feb. 27, 2003

(30) Foreign Application Priority Data

Aug. 24, 2001 (TW) .......................... 90120824 A

(51) Int. Cl.[7] .......................... H01L 23/58; H01L 21/66
(52) U.S. Cl. .......................................... 257/48; 438/18
(58) Field of Search .............................. 257/48; 438/14, 438/17–18; 324/765

(56) References Cited

U.S. PATENT DOCUMENTS 6,518,591 B1 * 2/2003 Shamble et al. .............. 257/48
2003/0003611 A1 * 1/2003 Weiner et al. ................ 438/16

* cited by examiner

*Primary Examiner*—Evan Pert
(74) *Attorney, Agent, or Firm*—Ladas & Parry

(57) ABSTRACT

The present invention provides an inline detection device for self-aligned contact defects, formed in a semiconductor substrate, comprising: an active area, formed in the semiconductor substrate, comprised of a serpentine gate having spacers on the side, a plurality of first contact windows nested immediately between the same spacers, a plurality of first contact plugs formed in the first contact windows, and two probing pads, formed in the semiconductor substrate, comprised of a plurality of matrix gates, a second contact window exposing portions of the matrix gates, and a second contact plug formed in the second contact window.

15 Claims, 5 Drawing Sheets

INLINE DETECTION DEVICE FOR SELF-ALIGNED CONTACT DEFECTS

BACKGROUND OF THE INVENTION

1. Field of the Invention

The present invention relates to an inline detection device for defects in semiconductor devices, and more particularly to an inline detection device for self-aligned contact defects.

2. Description of the Prior Art

In the continuous development of integrated circuits (IC) of higher density and chips in reduced size, misalignment of various layers is a major issue. Consequently, the self-aligned contact (SAC) process has evolved to reduce the distance between elements and increase the density of elements.

However, the tolerance for defects is reduced greatly as a consequence of reduced IC size and higher density. Therefore, defects must be improved to increase yield. The lower the defect density, the higher the yield. In order to detect defects in ICs, various tests are usually conducted at specific stages.

At the moment, the self-aligned contact process is conducted by etching between gates with the protection of spacers to avoid overetching. Thus, if the spacers are overetched, causing shorts, the performance of the products is severely affected and the yield is lowered. Conventional detection of defects is conducted after the formation of metal lines. According to the prior art, not only can the defects not be detected immediately following the formation of self-aligned contacts, needless waste of material and process time cannot be avoided. Therefore, the conventional detection method is far from ideal.

SUMMARY OF THE INVENTION

Another object of the present invention is to provide a method for fabricating an inline detection device for self-aligned contact defects utilizing general processes to form the inline detection device simultaneously with the semiconductor device without extra process steps.

Another object of the present invention is to provide an inline detection device having high sensitivity and increased detection efficiency to precisely detect defects in self-aligned contact/gates.

To achieve the above-mentioned objects, the present invention provides an inline detection device formed in a semiconductor substrate for self-aligned gate defects; the device comprising: an active area, formed on the semiconductor substrate, which is comprised of a serpentine gate, at a plurality of first contact window, nested immediately between the same spacer, a plurality of first contact plugs formed in the first contact windows, and two probing pads, formed in the semiconductor substrate, which is comprised of a plurality of matrix gates, a second contact windows exposing portions of the matrix gates, and a second contact plug formed in the second contact window.

According to the present invention, the method for fabricating an inline detection device for self-aligned contact defects comprises:

(a) providing a semiconductor substrate having an active area and two probing pad;

(b) forming a serpentine gate over the active area, wherein the serpentine gate divides the active area into two electrically disconnected areas connecting respectively with the two probing pads;

(c) forming a plurality of matrix gates over the two probing pads;

(d) forming spacers on two side of the serpentine gate;

(e) forming a plurality of first contact windows nesting immediately between the same spacer on the active area and forming a second contact window exposing portions of the matrix gates; and (f) forming a plurality of first contact plugs and a second contact plug in the first contact windows and the second contact window respectively; wherein each of the first contact plugs is for contacting with one of the two electrically disconnected areas of the active area.

In the inline detection device for self-aligned contact defects of the invention, the shape of the matrix gates is not limited, square or circular shapes used in the prior art can be adopted. Also, the pattern of the matrix gates are not limited, it can be distributed as a matrix.

In terms of material, the first contact plugs and the second contact plug are either tungsten or polysilicon. The spacer is dielectric material, such as silicon nitride.

The inline detection device for self-aligned contact defects of the invention is show in FIG. 1A, wherein the active area 10 having a serpentine gate 30 and a plurality of first contact windows 20 is divided into two parts by the serpentine gate 30. Two sides of the active area 10 are connected with probing pads 40, 50 respectively. In the probing pads 40 and 50, there are a second contact window 60 and a plurality of matrix gates 70 located at the bottom of the second contact window 60. The pattern of the serpentine gate 30 in tho active area 10 is not limited, as long as the serpentine gate divides the active area into two parts and they are not electrically connected. That is, the pattern shown in FIG. 1B can be adopted as well.

FIG. 2 is a cross-section of FIG. 1A along the line B–B'. In FIG. 2, 100 represents the semiconductor substrate of the active area, and 103 represents oxide. The plurality of the first contact windows 20 are nested immediately between the same spacer of the serpentine gate 101, wherein spacers 102 are formed on two sides of the first gate 101. In addition, the area outside of the active area AA is a first contact region 110 formed by ion implantation, and first contact plugs 105 fill the first contact windows 20.

FIG. 3 is a cross-section along the line C–C' in FIG. 1A. In FIG. 3, 200 represents the probing pads, 203 represents oxide, 60 represents the second contact window in FIG. 1, 201 represents plurality of the matrix gates formed at the bottom of the second contact window 60, 202 represents the spacers formed on the sides of the matrix gates 201, and 210 represents a second contact region formed by ion implantation outside the area of the matrix gates 201. In addition, the second contact window 60 is filled by a second contact plug 204. The plurality of matrix gates are used to prevent damage caused by plasma when etching contact windows and to avoid not filling the contact windows completely because of the larger size of the contact windows. Moreover, when taking electrical measurements, voltage applied can be distributed evenly throughout the probing pads.

The number and the shape of the matrix gates in the probing pads are not restricted and can be adjusted based on the number of the serpentine gate in the active area and the process conditions. However, in order to integrate the process, it is advantageous to have identical width for the serpentine gate and the matrix gate.

According to the detection device of the invention, the active area is divided into two electrically disconnected areas by the serpentine gate. Each of the first contact plugs is for contacting with one of the two electrically disconnected areas of the active area. Hence, if over etching occurs in the formation of the self-aligned contact, shorts will occur. In this circumstance, by applying the two probing pads to ground connection and a certain voltage respectively, defects in the active area will be detected.

BRIEF DESCRIPTION OF THE DRAWINGS

The present invention will become more fully understood from the detailed description of the preferred embodiments given hereinbelow and the accompanying drawings, given by way of illustration only and thus not intended to be limitative of the present invention.

PREFERRED EMBODIMENTS

FIGS. 4~7 show the process diagrams of the fabrication of the inline detection device according to an embodiment of the present invention. It is noted that the active area and the probing pads are formed simultaneously.

Figure 1A:
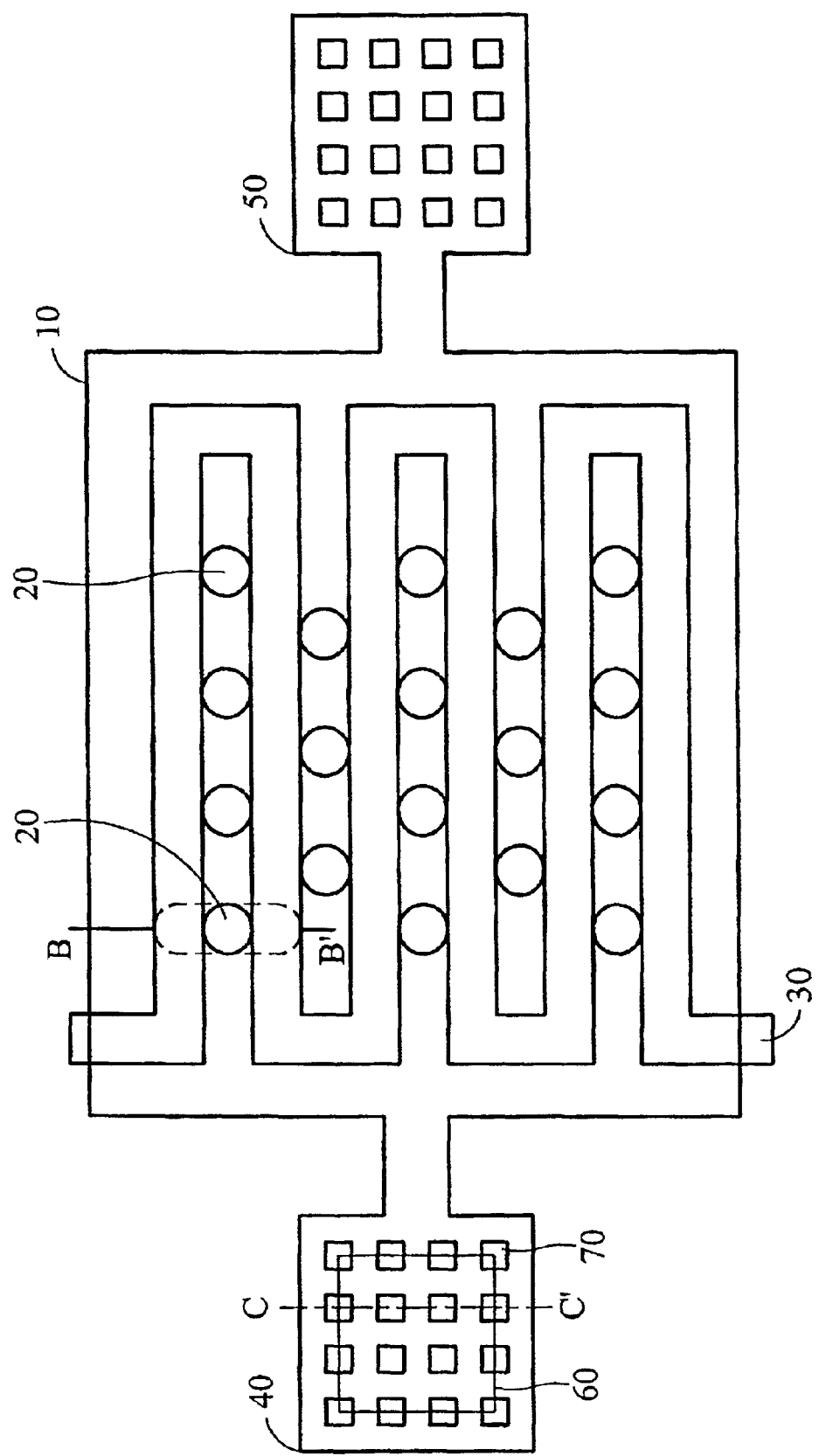
FIG. 1A is a top view of the inline detection device of the present invention.
Figure 1B:
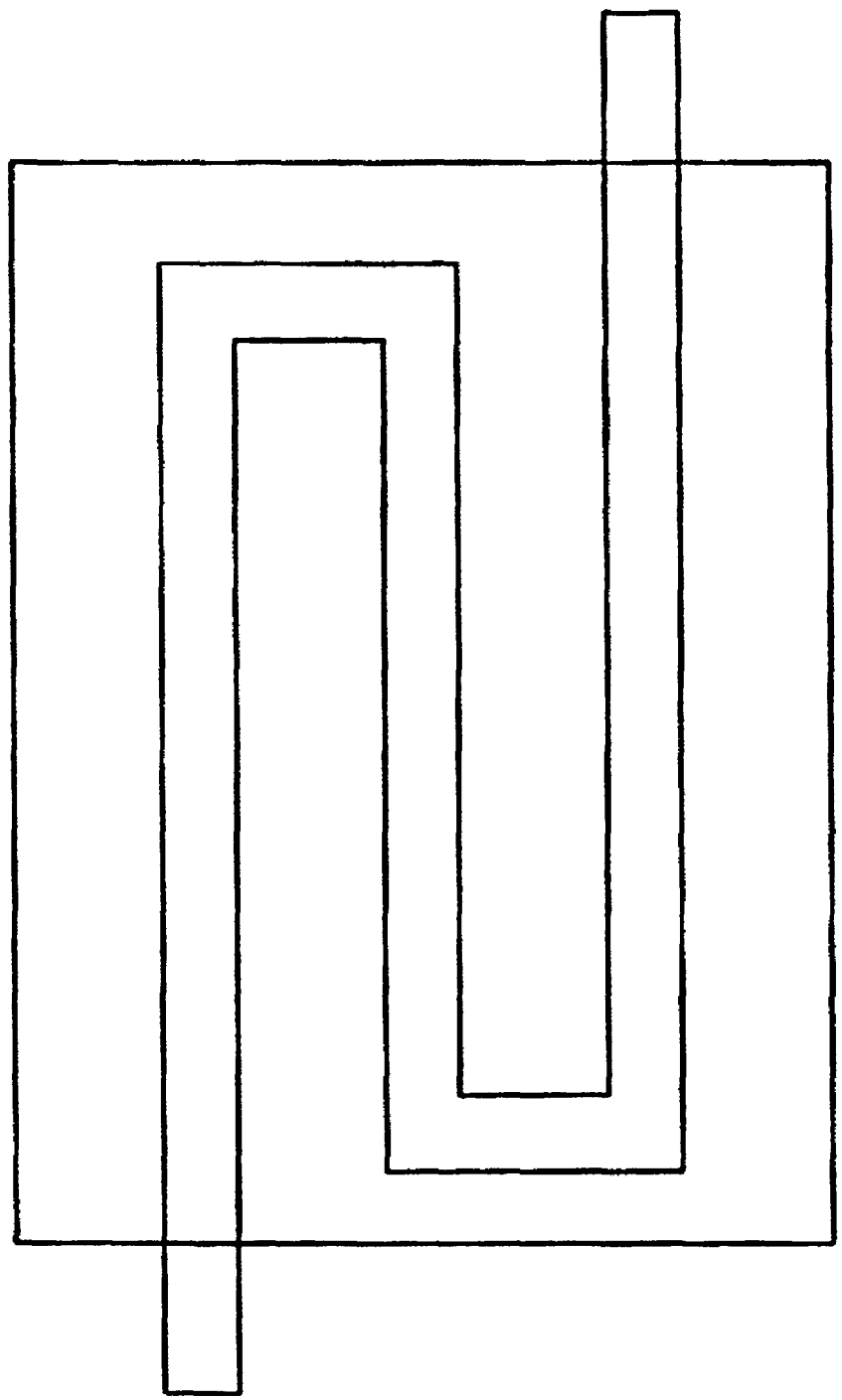
FIG. 1B shows another example of the pattern of the first gate in the active area of the inline detection device of the present invention.
Figure 2:
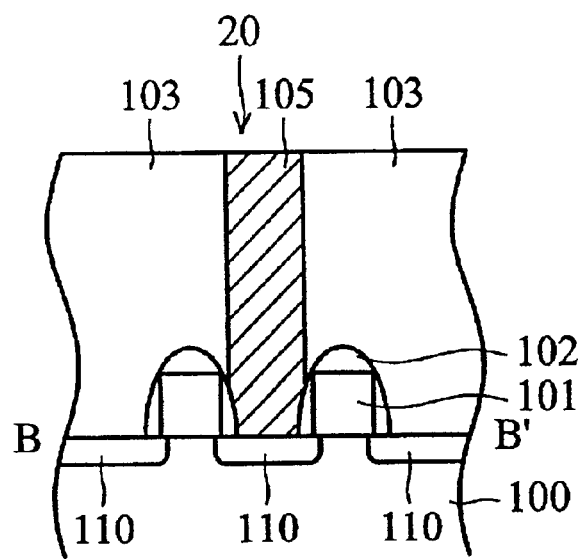
FIG. 2 is a schematic cross-section of the in-line device along the line B–B' in FIG. 1.
Figure 3:
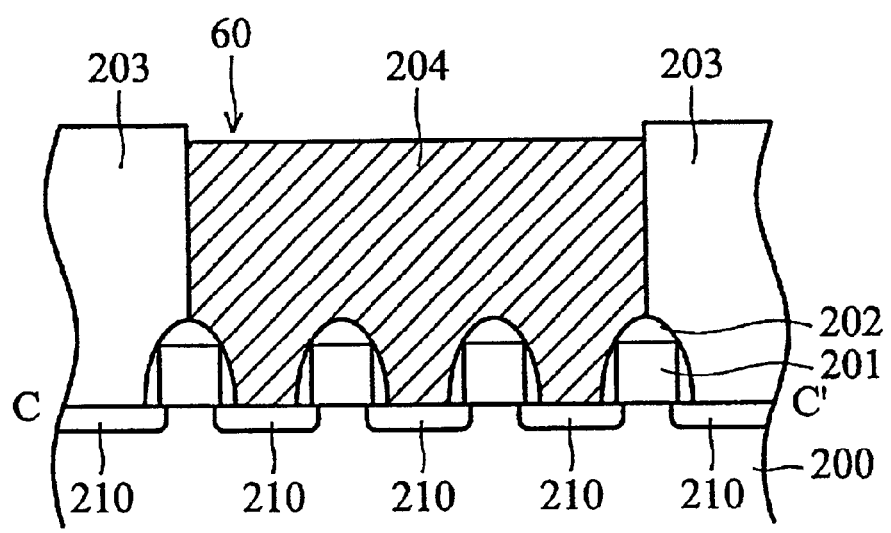
FIG. 3 is a cross-section of the in-line device along the line C–C' in FIG. 1.
Figure 4:
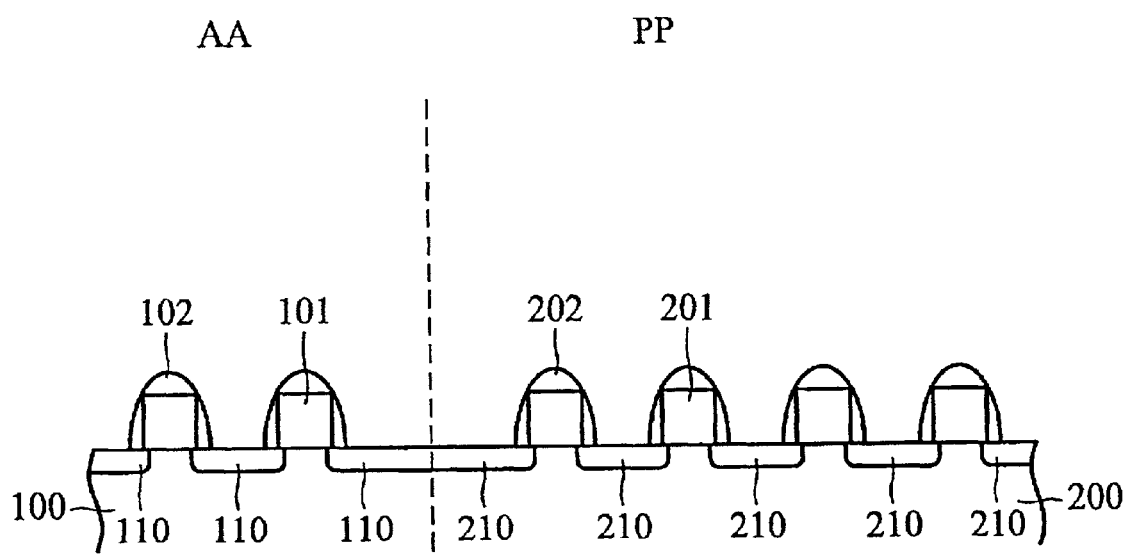
FIGS. 4–7 shows process diagrams according to an embodiment of the invention.

In FIG. 4, in order to show the simultaneous process in the active area (AA) and the probing pad (PP), a dotted line is drawn between AA and PP. An active area substrate 100 having a serpentine gate 101 with spacers 102 on the sides and a probing pad substrate 200 having a plurality of matrix gates 201 with spacers 202 on the sides are provided. Next, $N^+$ ions are implanted in the active area substrate and the probing pad substrate to form first contact regions 110 and second contact regions 210. In the embodiment, the path of the serpentine gate 101 in the active area (AA) is used to divide the active area into two electrically disconnected parts, and the shape of the second gate in PP is a 4×4 matrix (four gates; length by width). Therefore, in FIG. 4, four matrix gates 201 are shown to represent the cross-section of the probing pad.

Figure 5:
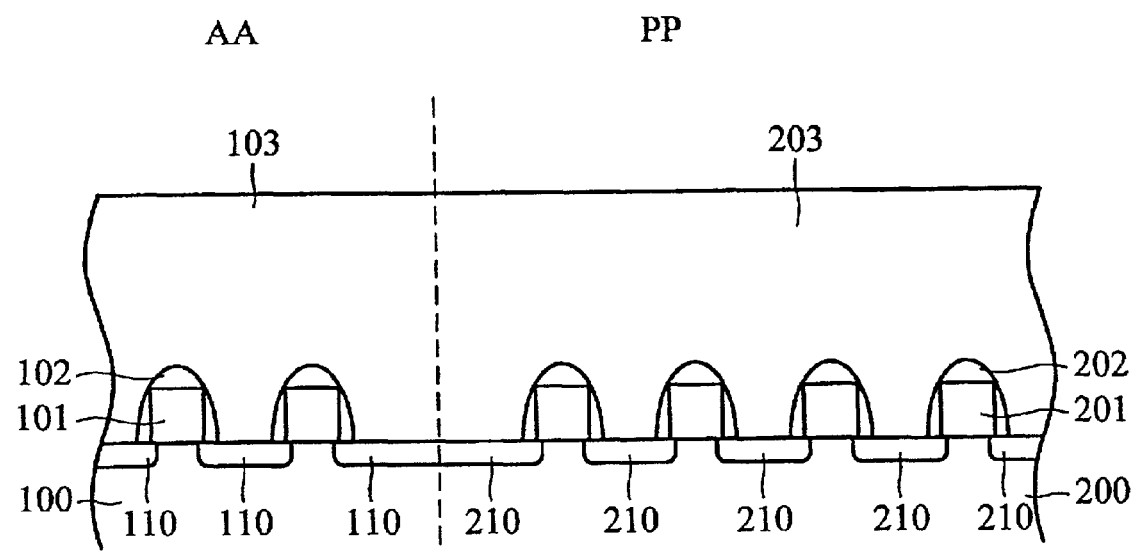
Figure 6:
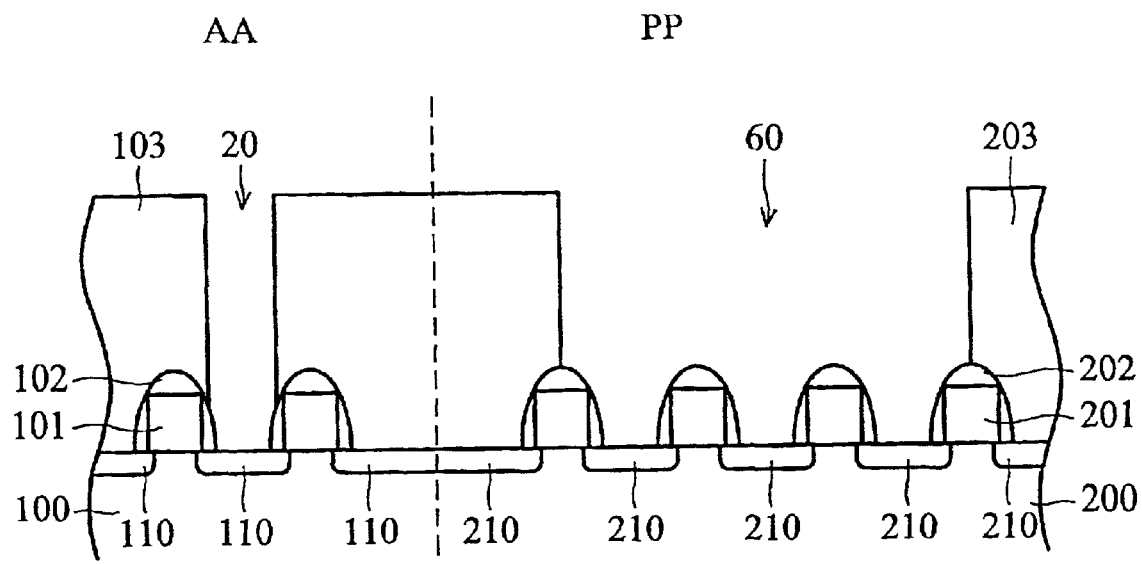

In FIG. 5, overall oxide layers 103 and 203 are formed to cover the serpentine gate 101 and the plurality of matrix gates 201. Therefore, as shown in FIG. 6, the oxide layers 103 and 203 are etched using the spacers 102, 202 as etching stop layer to form a number of first contact windows 20 in the active area. At the bottom of the first contact windows 20, the substrate 100 is exposed. Simultaneously, second contact windows 60 are formed in the probing pad to expose the matrix gates 202 with the remaining of the oxide 203 on half of the matrix gates 202 located on the edges.

Figure 7:
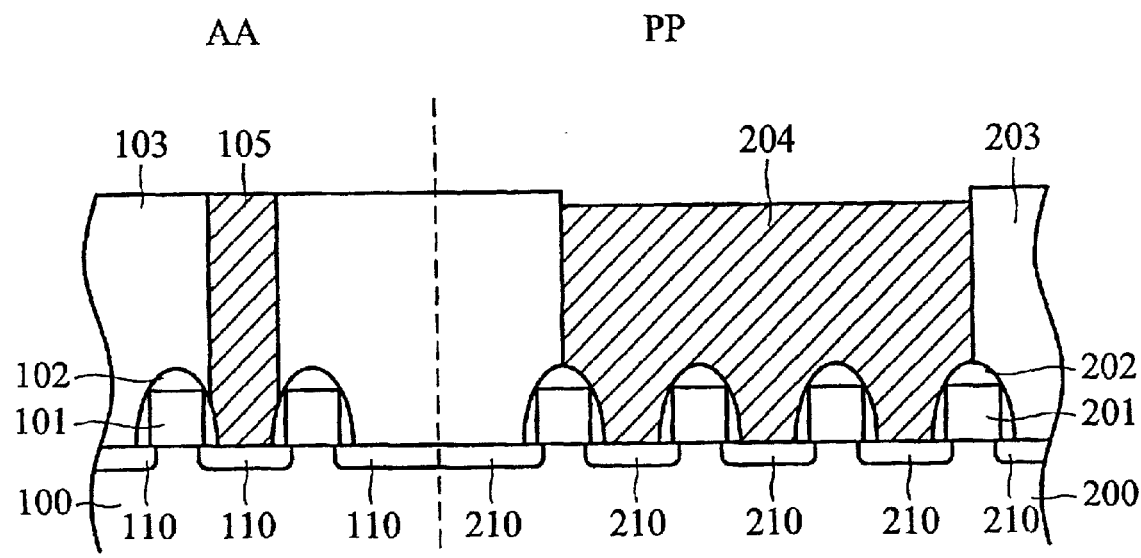

Finally, as shown in FIG. 7, the first contact windows in the active area and the second contact windows in the probing pad are filled with tungsten to form first contact plug 105 and second contact plugs 204.

One of the two probing pads of the inline detection device for self-aligned contact defects fabricated above is then earthed and the other pad is applied for a certain voltage for electrical measurement. If defects occurred in the active area, a current will be observed.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An inline detection device for self-aligned contact defects, comprising:
   an active area formed on a semiconductor substrate, comprised of:
      a serpentine gate over the active area dividing the active area into two electrically disconnected areas;
      spacers, formed on two sides of the serpentine gate;
      a plurality of first contact windows, nested immediately between the same spacer;
      a plurality of first contact plugs, formed in the first contact windows, for contacting with one of the two electrically disconnected areas; and
   two probing pads, respectively connected to the two electrically disconnected areas of the active area, each probing pad comprised of:
      a plurality of matrix gates
      a second contact window exposing portions of the matrix gates; and
      a second contact plug, formed in the second contact window.

2. The device as claimed in claim 1, wherein the shape of the second contact window, is either square or circular.

3. The device as claimed in claim 1, wherein the first contact plugs are either tungsten or polysilicon.

4. The device as claimed in claim 1, wherein the second contact plug is either tungsten or polysilicon.

5. The device as claimed in claim 1, wherein the serpentine gate is polysilicon.

6. The device as claimed in claim 1, wherein the matrix gates are polysilicon.

7. The device as claimed in claim 1, wherein the spacers are dielectric materials.

8. The device as claimed in claim 1, wherein the spacers are silicon nitride.

9. The method as claimed in claim 1, wherein the serpentine gate is polysilicon.

10. A method for fabricating an inline detection device for self-aligned contact defects, comprising:
   (a) providing a semiconductor substrate having an active area and two probing pads;
   (b) forming serpentine gate over the active area, wherein the serpentine gate divides the active area into two electrically disconnected areas connecting respectively with the two probing pads;
   (c) forming a plurality of a matrix gates over the two probing pads;
   (d) forming spacers on two side of the serpentine gate;
   (e) forming a plurality of first contact windows nesting immediately between the same spacer on the active area and forming a second contact window exposing portions of the matrix gate; and
   (f) forming a plurality of first contact plugs and a second contact plug in the first contact windows and the second contact window respectively;

wherein each of the first contact plugs is for contacting with one of the two electrically disconnected areas of the active area.

11. The method as claimed in claim 10, wherein the first contact plugs are either tungsten or polysilicon.

12. The method as claimed in claim 10, wherein the second contact plug is either tungsten or polysilicon.

13. The method as claimed in claim 10, wherein the matrix gates are polysilicon.

14. The method as claimed in claim 10, wherein the spacers are dielectric materials.

15. The method as claimed in claim 14, wherein the dielectric material is silicon nitride.

* * * * *